(12) United States Patent
Takeuchi et al.

(10) Patent No.: US 6,476,336 B1
(45) Date of Patent: Nov. 5, 2002

(54) CURRENT CONTROLLING ELEMENT

(75) Inventors: Yukihisa Takeuchi, Aichi (JP); Tsutomu Nanataki, Toyoake (JP); Iwao Ohwada, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 58 days.

(21) Appl. No.: 09/688,622

(22) Filed: Oct. 16, 2000

Related U.S. Application Data

(63) Continuation-in-part of application No. 09/649,349, filed on Aug. 28, 2000.

(51) Int. Cl.[7] .............................................. H01L 41/00
(52) U.S. Cl. ........................ 200/181; 310/324; 310/328
(58) Field of Search .......................... 200/181; 257/415, 257/422, 428, 666, 678, 686, 689, 690, 734; 310/324, 328, 357–359, 321, 346

(56) References Cited

U.S. PATENT DOCUMENTS

| | | | | |
|---|---|---|---|---|
| 5,210,455 A | * | 5/1993 | Takeuchi et al. | ............ 310/324 |
| 6,323,580 B1 | * | 11/2001 | Bernstein | ............ 310/324 |
| 6,327,760 B1 | * | 12/2001 | Yun et al. | ............ 29/25.35 |
| 6,342,751 B1 | * | 1/2002 | Takeuchi et al. | ............ 310/328 |

OTHER PUBLICATIONS

U.S. patent application Ser. No. 09/688,480, Takeuchi et al., filed Oct. 16, 2000.

* cited by examiner

*Primary Examiner*—Michael Friedhofer
(74) *Attorney, Agent, or Firm*—Burr & Brown

(57) ABSTRACT

An actuator having a fixed portion, a vibrating portion supported on the fixed portion so as to undergo vibrations, and an actuating portion including a first and a second electrodes formed on both sides or one side of a deformable layer is provided. The actuator generates displacement motion by holding the electric potential of the first electrode at a constant value and variably controlling the electric potential of the second electrode. A cathode for emitting electrons is formed on the actuator. The current controlling element changes the position of the cathode with respect to the plate by the displacement motion of the actuator to control a current value taken out of the plate.

44 Claims, 17 Drawing Sheets

FIG. 14A
FIG. 14B
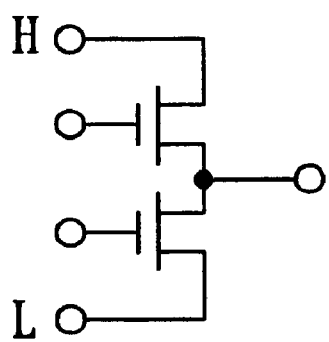
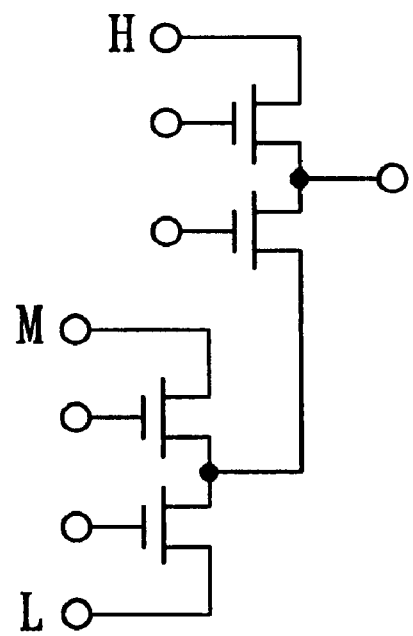

CURRENT CONTROLLING ELEMENT

This is a continuation-in-part of application Ser. No. 09/649,349 filed Aug. 28, 2000.

TECHNICAL FIELD

The present invention relates to current controlling elements which are designed to function as vacuum tubes such as diodes or triodes used for radios, television sets, and so on.

BACKGROUND ART

Such current controlling elements, or, the vacuum tubes or diodes, have a cathode for emitting electrons, and a plate for receiving the electrons emitted from the cathode, and the triode has not only the cathode and the plate, but also one grid. Such a current controlling element controls a plate voltage to take out a current from the plate.

However, a conventional current controlling element requires an element like a power amplifier in order to control the plate voltage, which causes an increase of the cost. Also, using such an element provides a disadvantage of increasing the power consumption. Besides, such a conventional current controlling element is difficult in integration especially when it is formed as a vacuum tube. Therefore, it is not suitable for the current controlling element with a comparatively small size and a comparatively high current value.

It is therefore an object of the present invention to provide a current controlling element which is capable of reducing the cost and the power consumption. It is another object of the present invention to provide a current controlling element which has a comparatively small size and a comparatively high power.

SUMMARY OF THE INVENTION

The present invention provides a current controlling element comprising an actuator having a fixed portion, a vibrating portion supported on the fixed portion so as to undergo vibrations, and an actuating portion including a first and a second electrodes formed on both sides or one side of a deformable layer, the actuator generating a displacement motion by holding an electric potential of the first electrode at a constant value and variable-controlling an electric potential of the second electrode, and a cathode formed on the actuator and emitting electrons. A plate for receiving the electrons emitted from the cathode is also provided. The current controlling element changes the position of the cathode with respect to the plate by the displacement motion of the actuator to control a current value taken out of the plate.

According to the present invention, the current value taken out of the plate is controlled by changing the position of the cathode with respect to the plate by a displacement motion of the actuator, thereby enabling the electric potential of the plate with respect to the cathode to be held at a constant value, which eliminates the need of disposing an element, like a power amplifier, for controlling a plate voltage. This makes the current controlling element with a relatively small size and a relatively low cost possible.

Also, the voltage applied to the first and the second electrodes is less than the plate voltage. Therefore, changing only the voltage less than the plate voltage enables the plate current to be controlled, which results in a decrease of the power consumption. Moreover, at least one grid electrode is disposed between the cathode and the plate. Moreover, the first electrode can serve as a cathode.

Equalizing the electric potential of the fist electrode to that of the cathode eliminates the need of forming an insulating layer between the first electrode and the cathode, which enables the forming process to be simplified. Further, by forming an insulating layer on the first electrode and/or the second electrode, and by forming the cathode on the insulating layer, it is possible to set a cathode voltage freely.

Preferably, the current controlling element comprises a plurality of cathodes corresponding to one plate, and a plurality of actuators corresponding to a plurality of cathodes, respectively. Thus integrating the actuators at a comparatively high density makes the current controlling element with a relatively small size and a relatively high current output possible.

Preferably, when constituting the actuator, the vibrating portion is formed of ceramics, the vibrating portion and the fixed portion are integrally formed, or the vibrating portion and the fixed portion are integrally formed of ceramics, or the actuating portion, the vibrating portion and the fixed portion are integrally formed. Further, the deformable layer is formed of at least one kind of a piezoelectric material, an electrostrictive material, and an antiferroelectric material.

Further, the current controlling device can be comprised of a plurality of the current controlling elements, and a substrate on which a plurality of the actuators of the current controlling elements are integrally formed. On this occasion, constituting a plurality of the current controlling elements as one element provides a current controlling device which is capable of generating a comparatively high current, or a current controlling device having a plurality of current controlling elements separated by a cell construction and integrated together.

The present invention provides a current controlling element including an actuator having a fixed portion, a vibrating portion supported on the fixed portion so as to undergo vibrations, and an actuating portion including a first and a second electrodes formed on both sides or one side of a deformable layer, the actuator generating a displacement motion by holding an electric potential of the first electrode at a constant value and variable-controlling an electric potential of the second electrode, a cathode being formed on the actuator and emitting electrons, and a plate receiving the electrons emitted from the cathode. The current controlling element changes the position of the cathode with respect to the plate by the displacement motion of the actuator to control a current value taken out of the plate, and the actuator maintains the displacement state by setting the electric potential of the first electrode at a certain value while holding the electric potential of the second electrode at the neighborhood of zero.

According to the present invention, as the actuator maintains the displacement state by setting the electric potential of the first electrode at a certain value while holding the electric potential of the second electrode at the neighborhood of zero, it is not necessary to apply the voltage continuously to the second electrode in order to maintain the displacement of the actuator. As a result, there is little power consumption resulting from the resistance of the current controlling element or a circuit including the current controlling element, and thus it is possible to reduce the power consumption of the current controlling element or the circuit including the current controlling circuit, because an actuator driving circuit is provided on the side of the second electrode and the power consumption resulting from the resistance of the actuator driving circuit can be omitted.

Preferably, the current controlling element further comprises a switching element which switches between the displacement motion and the maintenance of displacement state of the actuator. Thereby, the switching between the displacement motion and the maintenance of the displacement state of the actuator is well performed, so that it is not necessary to apply the voltage to the second electrode in order to maintain the displacement of the actuator, and thus it is possible to reduce the power consumption of the current controlling element or the circuit including the current controlling circuit further more. Also, as there is no limitation of the choice of the actuator material to be subjected to the displacement motion and the maintenance of displacement state of the actuator, and thus the limitation of the choice of the actuator material is relaxed. For example, the switching element has any one of transistor, a varistor and a piezoelectric relay. Especially, if the varistor is selected as the switching element, the limitation of choice of the actuator material is more relaxed because the good switching property can be obtained.

A current controlling element according to an embodiment of the present invention will be described with reference to the drawings.

BRIEF DESCRIPTION OF THE DRAWINGS

FIGS. 14A and 14B are views showing a circuit used in a word line driving circuit and a data line driving circuit, respectively.

DETAILED DESCRIPTION OF THE INVENTION

Figure 1:
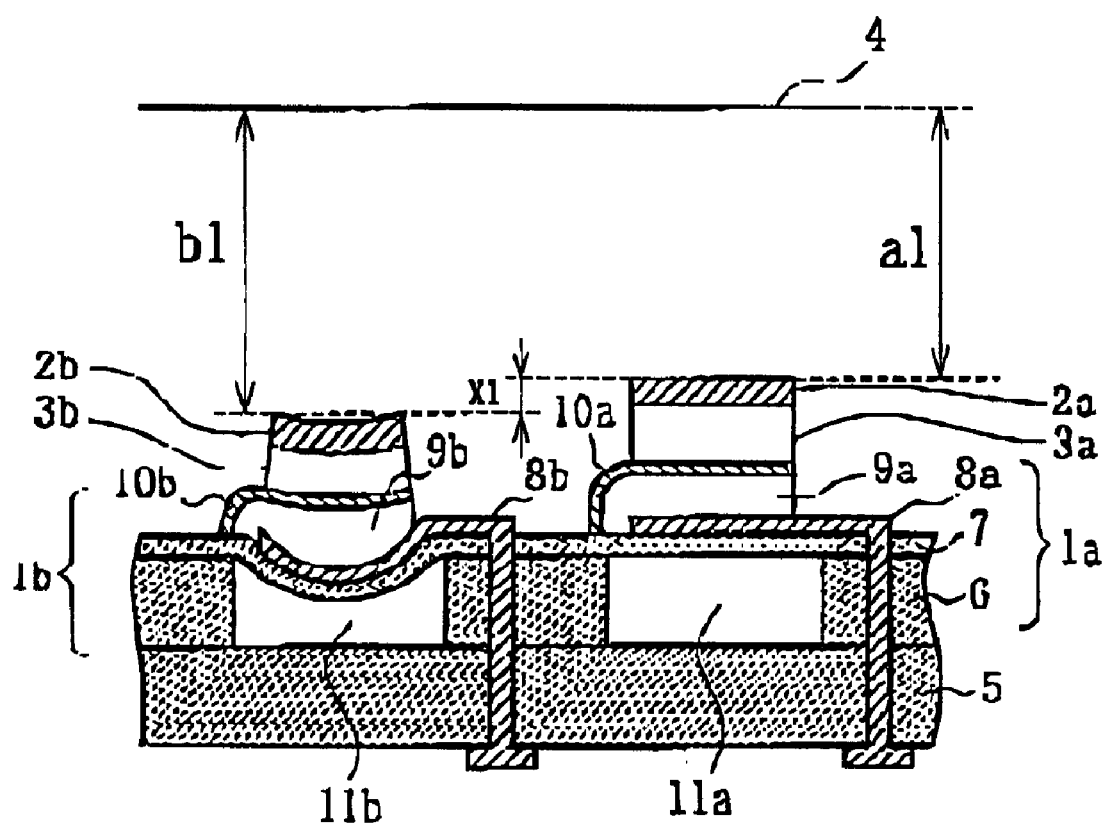
FIG. 1 is a sectional view of a current controlling element according to a first embodiment of the present invention.

FIG. 1 is a sectional view of a current controlling element according to a first embodiment of the present invention. The current controlling element comprises actuators $1a$, $1b$, cathodes $2a$, $2b$ formed on the actuators $1a$, $1b$ and emitting electrons, respectively, insulating layers $3a$, $3b$ interposed between the actuators $1a$, $1b$ and the cathodes $2a$, $2b$, respectively, and a common plate 4 receiving the electrons emitted from the cathodes $2a$, $2b$.

The illustrated current controlling element is integrated on a substrate 5, which provides a current controlling element. On this occasion, it is preferable to form a plurality of current controlling elements as one element to generate a high current, and to integrate a plurality of current controlling elements as an integrated circuit while separating them by a cell construction.

The actuator $1a$, $1b$ comprise a common spacer layer 6, as a fixed portion, formed on the substrate 5, a common sheet layer 7 as an vibrating portion, actuator driving electrodes $8a$, $8b$, as second electrodes, formed on the sheet layer 7, deformable layers $9a$, $9b$ formed on the actuator driving electrodes $8a$, $8b$, respectively, and actuator common electrodes $10a$, $10b$, as first electrodes, interposed between the insulating layers $3a$, $3b$ and the deformable layers $9a$, $9b$, respectively.

A way of forming the actuators $1a$, $1b$ and the substrate 5 is described in U.S. Pat. No. 5,210,455, one example of which is given as follows.

The sheet layer 7 is made to have a relatively small thickness, thereby causing the sheet layer 7 itself to be easily subjected to vibrations from the external stress. The sheet layer 7 is preferably formed of a high heat resistant material. This is because the sheet layer 7 is prevented from deteriorating when forming at least the deformable layers $9a$, $9b$ in a case where the sheet layer 7 directly supports the actuator driving electrodes $8a$, $8b$ without using a material of a relatively low heat resistance in joining the actuator driving electrodes $8a$, $8b$ to the sheet layer 7.

Further, it is preferred that the sheet layer 7 is formed of an insulating material in order to electrically separate wires formed on the substrate 5 and electrically connected to the actuator driving electrodes $8a$, $8b$, and wires similarly formed on the substrate 5 and electrically connected to the actuator common electrodes 10a, 10b.

Accordingly, it is the best that the sheet layer 7 is made of ceramics, although the sheet layer 7 can be formed of a high heat resistant metal or a material, like porcelain enameled finished material, of a high heat resistant metal coated with a ceramics material such as glass.

A ceramic composition forming the sheet layer 7 includes, for example, stabilized zirconium oxide, aluminum oxide, magnesium oxide, titanium oxide, spinel, mullite, aluminum nitride, silicon nitride, glass, mixtures thereof, and the like. Among them, the stabilized zirconium oxide and the aluminum oxide are preferable from the viewpoint of strength and rigidity. The stabilized zirconium oxide is especially preferable because it causes the sheet layer 7 to have a relatively high mechanical strength and a relatively high toughness even if the sheet layer 7 has a small thickness, it undergoes relatively less chemical reaction with the actuator driving electrodes 8a, 8b, the deformable layers 9a, 9b, and the actuator common electrodes 10a, 10b, and the like. Moreover, the stabilized zirconium oxide includes not only usual stabilized zirconium oxide but also partially stabilized zirconium oxide. The stabilized zirconium has a crystal structure such as cubic crystal, thereby providing no phase transition.

On the other hand, the zirconium oxide may undergo phase transition between monoclinic crystal and tetragonal crystal at about 1000° C., therefore, such phase transition may provide cracking. The stabilized zirconium contains 1–30 mole % of a stabilizing material such as calcium oxide, magnesium oxide, yttrium oxide, scandium oxide, ytterbium oxide, cerium oxide, rare earth metal oxide, and the like. Preferably, the stabilizing material contains yttrium oxide in order to improve the mechanical strength of the sheet layer 7. On this occasion, it contains preferably 1.5–6 mole %, more preferably 2–4 mole % of yttrium oxide, and further preferably contains 0.1–5 mole % of aluminum oxide.

Besides, the crystal phase can be of a mixture phase of cubic crystal+monoclinic crystal, a mixture phase of tetragonal crystal+monoclinic crystal, a mixture phase of cubic crystal+tetragonal crystal+monoclinic crystal, and the like. It is the most preferable to contain mainly the tetragonal crystal, or the mixture phase of tetragonal crystal+cubic crystal among the above phases from the viewpoint of strength, toughness and durability.

When the sheet layer 7 is formed of ceramics, the sheet layer 7 contains relatively many crystal particles. For improving the mechanical strength of the sheet layer 7, the average crystal particle size is preferably held within a range of 0.05–2 μm, more preferably within a range of 0.1–1 μm.

The spacer layer 6 has cavities 11a, 11b at locations corresponding to the actuators 1a, 1b, respectively. Such cavities 11a, 11b are formed by the use of, e.g. a screen printing method.

The spacer layer 6 is preferably formed of a ceramic material, more specifically the material may be the same as the ceramic of the sheet layer 7 or different from the ceramic of the sheet layer 7. Such ceramic material includes, for example, stabilized zirconium oxide, aluminum oxide, magnesium oxide, titanium oxide, spinel, mullite, aluminum nitride, silicon nitride, glass, mixtures thereof, and the like, as is the case with the ceramics material of the sheet layer 7.

The ceramic materials, except those of the substrate 5, the spacer layer 6, and the sheet layer 7, preferably include a material of zirconium oxide as a major component, a material of aluminum oxide as a major component, a material of mixtures thereof as a major component, and the like. Among them, the material of zirconium oxide as a major component is especially preferable. Moreover, clay, and so on may be added thereto as a sintering assistant. On this occasion, the assistant composition is required to be adjusted so as not to excessively contain vitrescent materials, such as silicone oxide and boron oxide. This is because, although these vitrescent materials are advantageous from the viewpoint of joining with the deformable layers 9a, 9b, the vitrescent material accelerates the reaction with the actuator common electrodes 10a, 10b, thereby making it difficult for the deformable layers 9a, 9b to maintain a predetermined composition, which results in deterioration of the properties of the element.

In other words, preferably, silicone oxide, and so on contained in the substrate 5, the spacer layer 6 and the sheet layer 7 is limited so as to be not more than 3 wt %, preferably not more than 1 wt %. In this specification, the word "main component" means a component, the contents of which are not less than 50 wt %.

Preferably, the substrate 5, the spacer layer 6, and the sheet layer 7 are laminated into a three-layered product. These three layers are integrally joined to one another by simultaneous firing, or by afterward bonding by using glass or resin. Moreover, a four or more-layered product can be produced.

The actuator driving electrodes 8a, 8b are applied with a variable voltage from a power supply (not shown). These actuator driving electrodes 8a, 8b are formed of any electrically conductive material which can withstand oxidizing high temperature atmospheres, for example, a single metal, an alloy, a mixture of a metal or alloy, a mixture of an electrically insulating ceramic and alloy, preferably, high melting point noble metal such as platinum, palladium, or rhodium, or a material containing silver-palladium alloy, silver-platinum alloy or platinum-palladium alloy, and the like as a major component or components, or a cermet material of platinum and ceramic material. More preferably, it is formed of only platinum, or a material containing a platinum-based alloy as a major component or components. Moreover, the percentage of the ceramic material content in the electrode material is preferably 5–30 vol %. Further, the percentage is preferably 5–20 vol % when using a piezoelectric material/electrostrictive material as the ceramic material.

The actuator driving electrodes 8a, 8b can be formed by a usual film forming method, including various kinds of thick-film forming methods, such as screen printing, spray, coating, dipping, application, electrophoresis, and various kinds of thin-film forming methods such as sputtering, ion-beam, vacuum vapor deposition, ion plating, CVD, and plating. Preferably, the thick-film forming method is employed.

When the actuator driving electrodes 8a, 8b are formed by the thick-film forming method, their thickness is generally not more than 20 μm, preferably not more than 5 μm.

The deformable layers 9a, 9b are displaced by application of an electric field, and formed of at least one kind of a piezoelectric material, an electrostrictive material, and an antiferroelectric material. The piezoelectric material and/or the electrostrictive material can include a material containing lead zirconate (PMN-based) as a major component, a material containing lead nickel niobate (PNN-based) as a major component, a material containing lead zinc niobate as a major component, a material containing lead manganese niobate as a major component, a material containing lead magnesium tantalate as a major component, a material containing lead nickel tantalate as a major component, a material containing lead antimony stannate as a major component, a material containing lead titanate as a major component, a material containing lead magnesium tungstate as a major component, a material containing lead cobalt niobate as a major component, or composite materials containing any combination thereof as a major component. Among these, ceramics containing lead magnesium tungstate is most frequently used as the piezoelectric material and/or the electrostrictive material.

When the piezoelectric material and/or electrostrictive material are made of ceramics, the material can include oxides of lanthanum, barium, niobium, zinc, cerium, cadmium, chromium, cobalt, antimony, iron, yttrium, tantalum, tungsten, nickel, manganese, lithium, strontium, bithmus, and the like, or any combination thereof, or materials suitably added with other compounds. These materials are preferably added with a predetermined additive into, for example, a PLZT-based material.

Among these piezoelectric materials and/or electrostrictive materials, there are preferably employed materials containing lead magnesium niobate, lead zirconate, and lead titanate as major components, materials containing lead nickel niobate, lead magnesium niobate, lead zirconate, and lead titanate as major components, materials containing lead magnesium niobate, lead nickel tantalate, lead zirconate, and lead titanate as major components, materials containing lead magnesium tantalate, lead magnesium niobate, lead zirconate, and lead titanate as major composition, and materials with strontium and/or lanthanum substituted for a part of lead, and the like. These materials are preferable as the deformable layers 9a, 9b which are formed by a thick-film forming method, such as screen printing.

When multicomponent piezoelectric material and/or electrostrictive materials are employed, the piezoelectric and/or electrostrictive properties are varied according to the composition of the component. Especially, not only for a three component-based material of lead magnesium niobate-lead zirconate-lead titanate employed in this embodiment, but also for four component-based materials of lead magnesium niobate-lead nickel tantalate-lead titanate, and lead magnesium tantalate-lead magnesium niobate-lead nickel tantalate-lead titanate, the composition in the vicinity of the boarder of pseudo-cubic crystal-tetragonal crystal-rhombohedral crystal is preferable. Especially, a composition of lead magnesium niobate: 15–50 mole %, lead zirconate: 10–45 mole %, and lead titanate: 30–45 mole %, a composition of lead magnesium niobate: 15–50 mole %, lead nickel tantalate: 10–40 mole %, lead zirconate: 10–45 mole %, and lead titanate: 30–45 mole %, and a composition of lead magnesium niobate: 15–50 mole %, lead nickel tantalate: 10–40 mole %, lead zirconate: 10–45 mole %, and lead titanate: 30–45 mole % are preferably employed because they have a high piezoelectric constant and a high electromechanical coupling factor.

Further, when an antiferroelectric material is employed, the material preferably includes a material containing lead zirconate as a major component, a material containing lead zirconate and lead stannate as major components, a material containing lead zirconate added with lanthanum oxide, and a material containing lead zirconate and lead stannate as major components added with lead zirconate and lead niobate. Particularly, when the driving voltage is low, the antiferroelectric material including lead zirconate and lead stannate is preferably employed. The composition is given as:

$$Pb_{0.99}Nb_{0.02}[(Zr_xSn_{1-x})_{1-y}Ti_y]_{0.98}O_3$$

$$(0.5 < x < 0.6,\ 0.05 < y < 0.063)$$

Besides, the antiferroelectric material may be porous. On this occasion, the porosity is preferably not more than 30%.

The deformable layers 9a, 9b are preferably formed by the use of the above-mentioned thick-film forming method. Particularly, the screen printing method is preferably used because it performs the printing precisely at a low cost. Moreover, the thickness of the deformable layers 9a, 9b is preferably not more than 50 μm, more preferably not more than 3–40 μm, e.g. in order to provide a large displacement at a low operating voltage.

Such a thick-film forming method is capable of forming a film on a surface of the sheet layer 7, using a paste or slurry containing, e.g. piezoelectric and/or electrostrictive ceramic particles of 0.01–7 μm, preferably, 0.05–5 μm in average particle diameter as major components, which provides excellent element properties.

The electrophoresis method is capable of forming a film at high density and at highly accurate dimensions, and has characteristics described in the technical document "DENKI KAGAKU 53, No. 1(1985), p63–68, authored by Kazuo ANZAI)" and "The Fist Study Symposium of Ceramics Higher-Order Forming Method by Electrophoresis, preliminary report (1998), p5–6, p23–23." Accordingly, it is preferred that various kinds of methods are suitably selectively employed, considering required accuracy and reliability.

In the case where the deformable layers 9a, 9b are formed of piezoelectric materials, when applied with no electric field, the deformable layer is flat as shown by reference number 9a, whereas when applied with an electric field, an electric field induced strain occurs to provide its lateral effect, thereby causing the deformable layer to be curvedly displaced in a concave manner as shown reference number 9b.

On the other hand, in a case where the deformable layers 9a, 9b are formed of an antiferroelectric material, when applied with no electric field, the deformable layer is flat, whereas when applied with an electric field, the deformable layer is curvedly displaced in a convex manner.

The actuator common electrodes 10a, 10b, while being held at a constant electric potential, e.g. 0 V, are commonly connected to the actuators 1a, 1b, respectively, and then wired out of a back side of the substrate 5 through holes.

The actuator common electrodes 10a, 10b are preferably formed by the above-mentioned thick-film forming method, although they can be formed by the same material and the same method as the actuator driving electrodes 8a, 8b. The actuator common electrodes 10a, 10b are generally not more than 20 μm, preferably not more than 5 μm. Moreover, the total thickness of the actuator driving electrode 8a, 8b, the deformable layer 9a, 9b, and the actuator common electrode 10a, 10b is generally not more than 100 μm, preferably 50 μm.

As described above, whenever they are formed, respectively, the actuator driving electrodes 8a, 8b, the deformable layers 9a, 9b, and the actuator common electrodes 10a, 10b are heat-treated, that is, fired to be integrally formed with the sheet layer 7 into an integral construction. Otherwise, after they are all formed, the actuator driving electrodes 8a, 8b, the deformable layers 9a, 9b, and the actuator common electrodes 10a, 10b can simultaneously heat-treated, that is, fired to be simultaneously integrally joined with the sheet layer 7.

Moreover, according to a method of forming the actuator driving electrodes 8a, 8b, and the actuator common electrodes 10a, 10b, there may be no need for heat-treatment, that is, firing for integration.

The heat-treatment, that is, firing, for integrating the sheet layer 7, the actuator driving electrodes 8a, 8b, the deformable layers 9a, 9b, and the actuator common electrodes 10a, 10b is generally effected at a temperature within 500–1400° C., preferably a temperature within 1000–1400° C. Further, when heat-treating the film-like deformable layers 9a, 9b, the heat-treatment, that is, firing, is preferably employed while controlling not only the evaporation sources of the deformable layers 9a, 9b but also their atmosphere, such that the deformable layers 9a, 9b become unstable in composition at a high temperature. Further, the firing is preferably employed while covering the deformable layers 9a, 9b with a suitable covering member such that the deformable layers 9a, 9b are not directly exposed to the firing atmosphere. On this occasion, the covering member is made of a material similar to those of the substrate 5 and the spacer layer 6.

The insulating layers 3a, 3b are also made of a material similar to that of the substrate 5 and the spacer layer 6. The cathodes 2a, 2b are formed by the same material and the same method as the actuator driving electrodes 8a, 8b and the actuator common electrodes 10a, 10b, and then wired out of a back side of the substrate 5 via through holes.

An operation of this embodiment will be described hereinbelow. In this embodiment, the actuator is made of a piezoelectric material, and the actuator common electrodes 10a, 10b are set to 0 V. When the actuator driving electrodes 8a, 8b are not applied with a voltage, a distance $d_{PK}$ between the plate 4 and the cathode 2a takes a1 as shown in the actuator 1a, whereas when the actuator driving electrodes 8a, 8b are applied with a variable voltage $V_P$, the distance $d_{PK}$ between the plate 4 and the cathode 2b takes b1.

Figure 2:
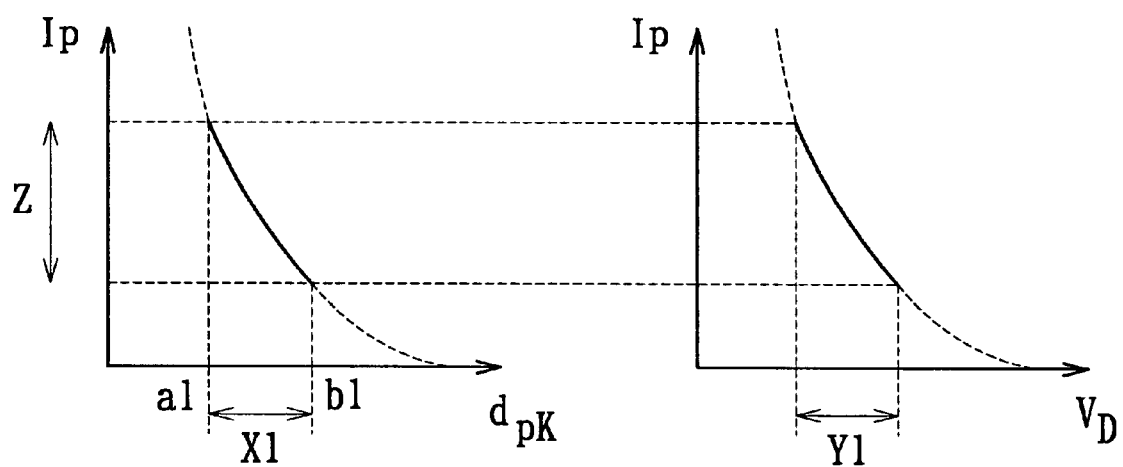
FIG. 2 is a view showing the relationship between a cathode-to-plate distance and a plate current, and the relationship between the cathode-to-plate distance and a voltage applied to an actuator driving electrode, in the first embodiment.

As shown in FIG. 2, the longer the distance $d_{PK}$ is, the smaller the plate current $I_P$ is. That is, the plate current $I_P$ is continuously changed in the current controlled range Z according to the variable stroke X1 of the actuator corresponding to a difference between lengths b1 and a1, which allows the current to be amplified preferably. Moreover, in FIG. 2, positive values for the distance $d_{PK}$ are measured in such a direction as that the cathodes 2a, 2b get away from the plate 4, while positive values for the variable voltage $V_D$ are measured in the polarization direction of the deformable layers 9a, 9b.

Moreover, in order to permit the distance $d_{PK}$ to change within the variable stroke X1, a voltage applied to the actuator driving electrodes 8a, 8b is changed within the voltage controlled range Y1 between a voltage Va1 and a voltage Vb1.

Figure 3:
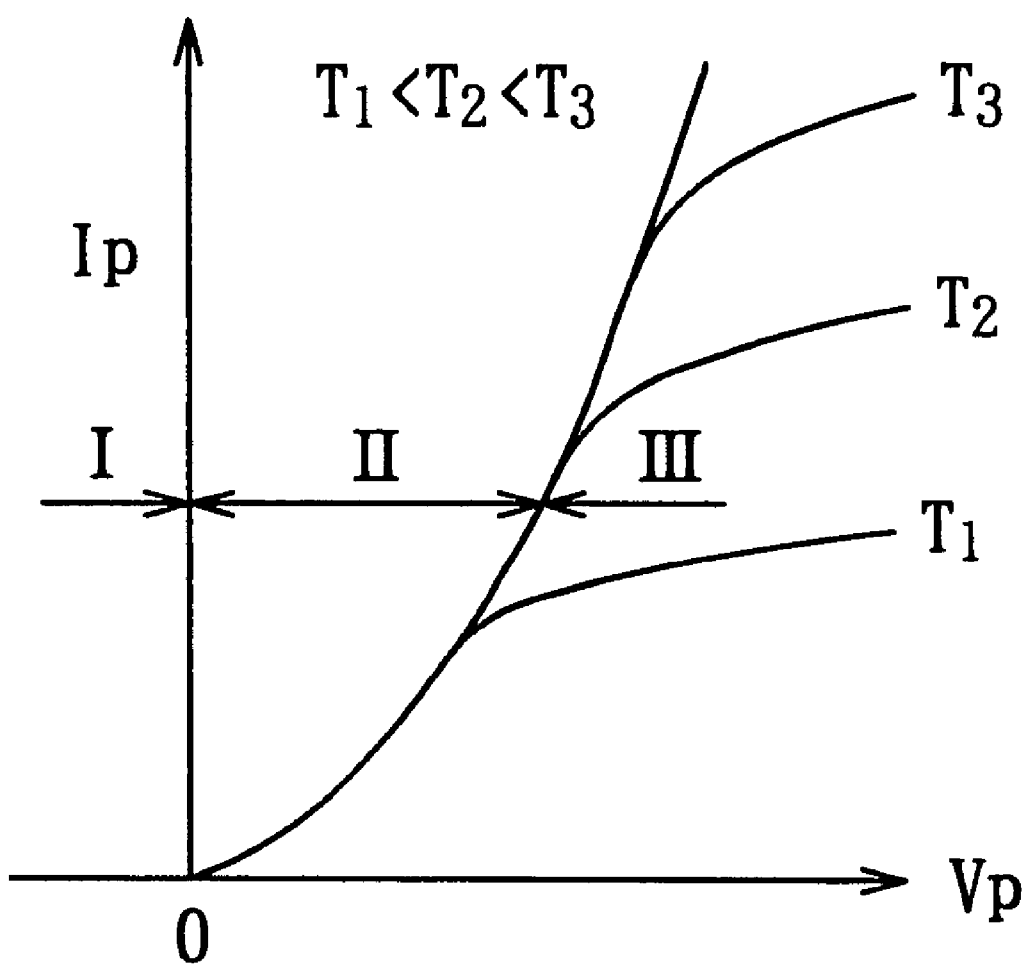
FIG. 3 is a view showing the property of a diode.

FIG. 3 is view of the property of a diode. In FIG. 3, the property has an initial velocity current region I in which the plate current $I_P$ is very small, a space charge controlled region II in which the $I_P$ value satisfies $I_P=GV_P^{3/2}$, and a temperature controlled region (saturation region) III in which the $I_P$ value changes according to the temperature. On this occasion, G denotes a constant (perviance), and temperatures T1, T2, T3 satisfy the inequality T1<T2<T3. Setting the movable stroke X1 in such a manner that the current controlled range Z in FIG. 2 corresponds to the space charge controlled region II widens the control range of the plate current $I_P$.

According to this embodiment, the displacement motion of the actuators 1a, 1b makes the position of the cathodes 2a, 2b with respect to the plate 4 variable, thereby causing the current $I_P$ taken out of the plate 4 to be controlled. This makes a plate voltage $V_P$ constant, thereby eliminating the need for elements of controlling the plate voltage, such as power amplifiers, which lowers the cost.

Further, integrating the actuators 1a, 1b at a high density miniaturizes the current controlling element, and generates a high current. Besides, a voltage applied to the actuator driving electrodes 8a, 8b and the actuator common electrodes 10a, 10b is lower than the plate voltage. Therefore, making only a voltage lower than the plate voltage variable enables the plate current to be controlled, which reduces the power consumption.

Figure 4:
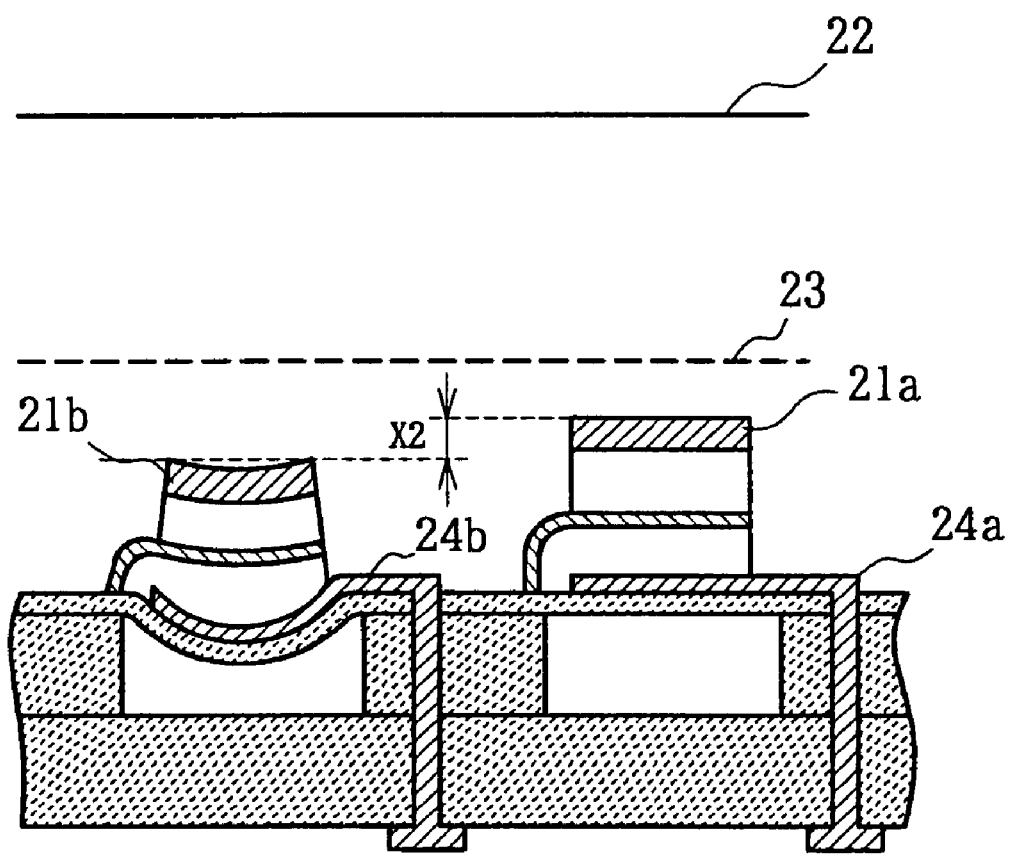
FIG. 4 is a sectional view of a current controlling element according to a second embodiment of the present invention.
Figure 5:
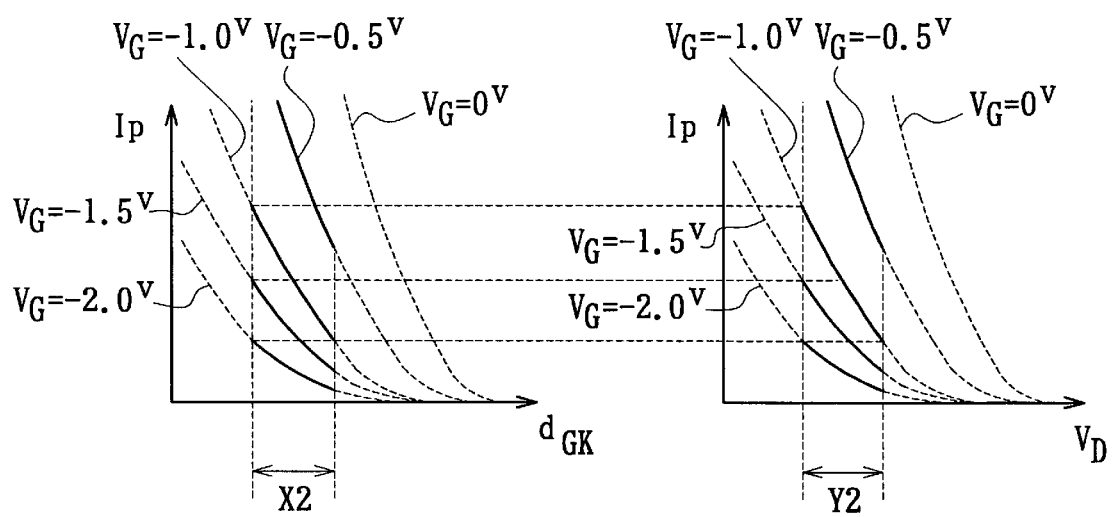
FIG. 5 is a view showing the relationship between a grid-to-plate distance and a plate current, and the relationship between a voltage applied to an actuator driving electrode and a plate current, in the second embodiment.

FIG. 4 is a sectional view of a current controlling element according to a second embodiment of the present invention. In this embodiment, a grid 23 is arranged between cathodes 21a, 21b and a plate 22, thereby causing the current controlling element to serve as a triode. In this embodiment, there is shown in FIG. 5 the relationship between the distance $d_{GK}$ between the cathodes 21a, 21b and the grid 23, and a plate current $I_P$, and the relationship between a voltage $V_D$ applied to actuator driving electrodes 24a, 24b. On this occasion, controlling the actuator driving voltage in a range of Y2 provides a variable stroke control range X2, thereby causing the plate current $I_P$ corresponding the gate voltage $V_G$ to be taken out. Moreover, in FIG. 5, the gate voltage $V_G$ is changed between 0 to −2.5 V by −0.5 V at a time.

Further, controlling a distance $D_{GK}$ provides a function similar to gates of a three-terminal thyristor or a transistor, thereby increasing an electric control parameter, which enables the required specification to be flexibly coped with.

Figure 6:
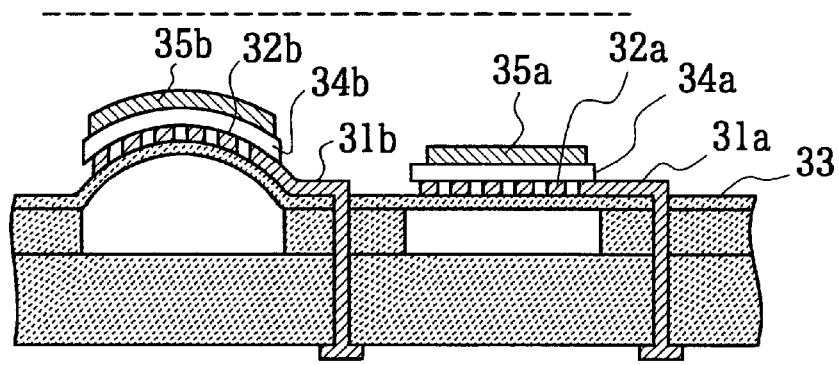
FIG. 6 is a sectional view of a current controlling element according to a third embodiment of the present invention.

FIG. 6 is a sectional view of a current controlling element according to a third embodiment of the present invention. In this embodiment, actuator driving electrodes 31a, 31b and actuator common electrodes 32a, 32b are interposed, respectively, between a sheet layer 33 and deformable layers 34a, 34b in a comb-like opposed manner, and cathodes 35a, 35b are directly formed on deformable layers 34a, 34b.

Figure 7:
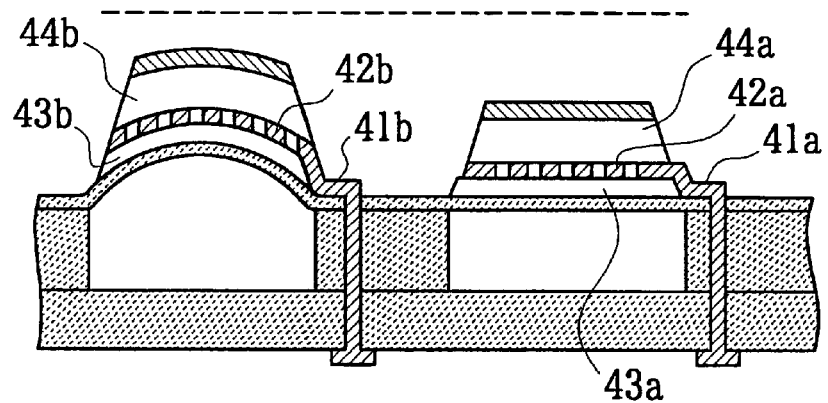
FIG. 7 is a sectional view of a current controlling element according to a fourth embodiment of the present invention.

FIG. 7 is a sectional view of a current controlling element according to a fourth embodiment of the present invention. In this embodiment, actuator driving electrodes 41a, 41b and actuator common electrodes 42a, 42b are interposed, respectively, between deformable layers 43a, 43b and insulating layers 44a, 44b in a comb-like opposed manner.

Figure 8:
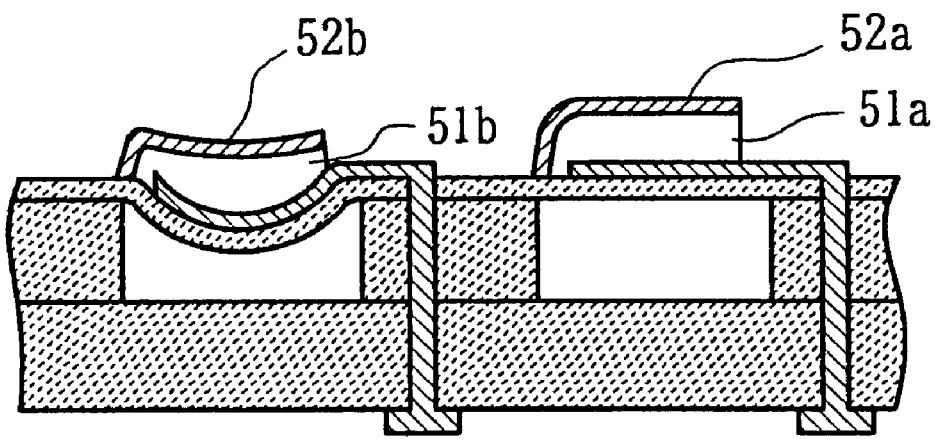
FIG. 8 is a sectional view of a current controlling element according to a fifth embodiment of the present invention.

FIG. 8 is a sectional view of a current controlling element according to a fifth embodiment of the present invention. In this embodiment, actuator common electrodes 52a, 52b disposed on deformable layers 51a, 51b also serve as cathodes.

Figure 9:
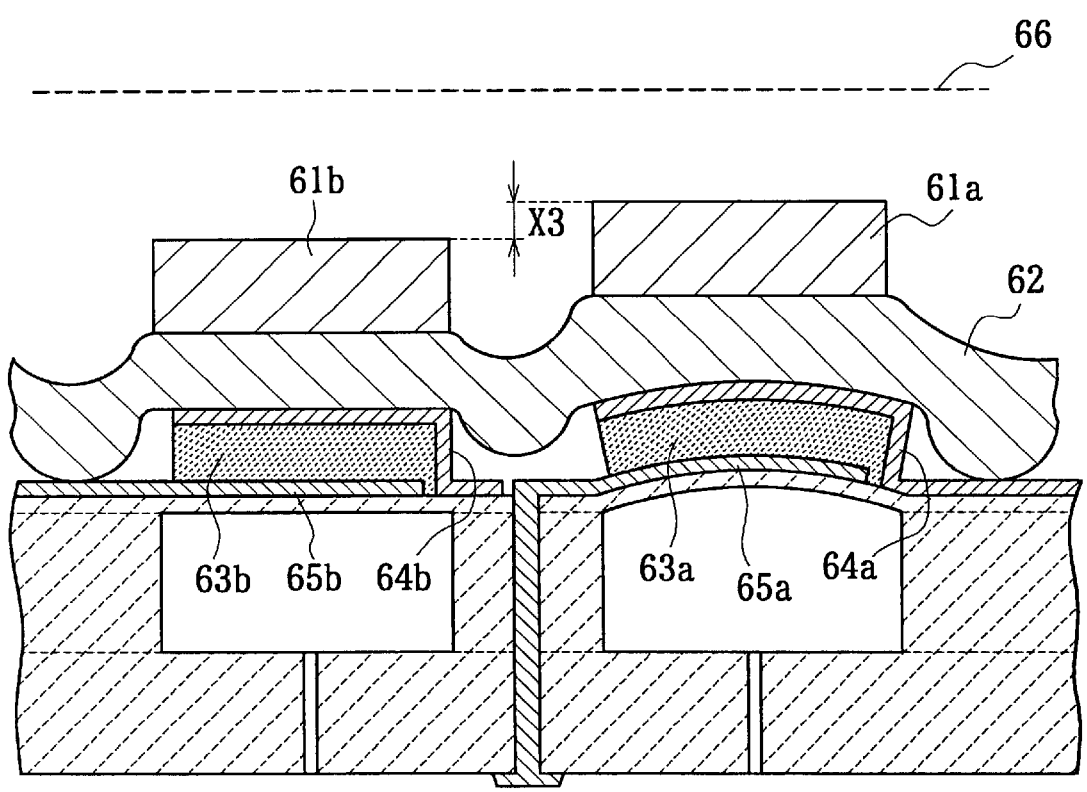
FIG. 9 is a sectional view of a current controlling element according to a sixth embodiment of the present invention.

FIG. 9 is a sectional view of a current controlling element according to a sixth embodiment of the present invention. In this embodiment, cathodes 61a, 61b are formed on a insulating layer 62. Deformable layers 63a, 63b are formed of antiferroelectric material, a predetermined voltage $V_C$ is applied to actuator common electrode 64a, 64b, and a variable voltage $V_D$ is applied to actuator driving electrodes 65a, 65b.

Figure 10:
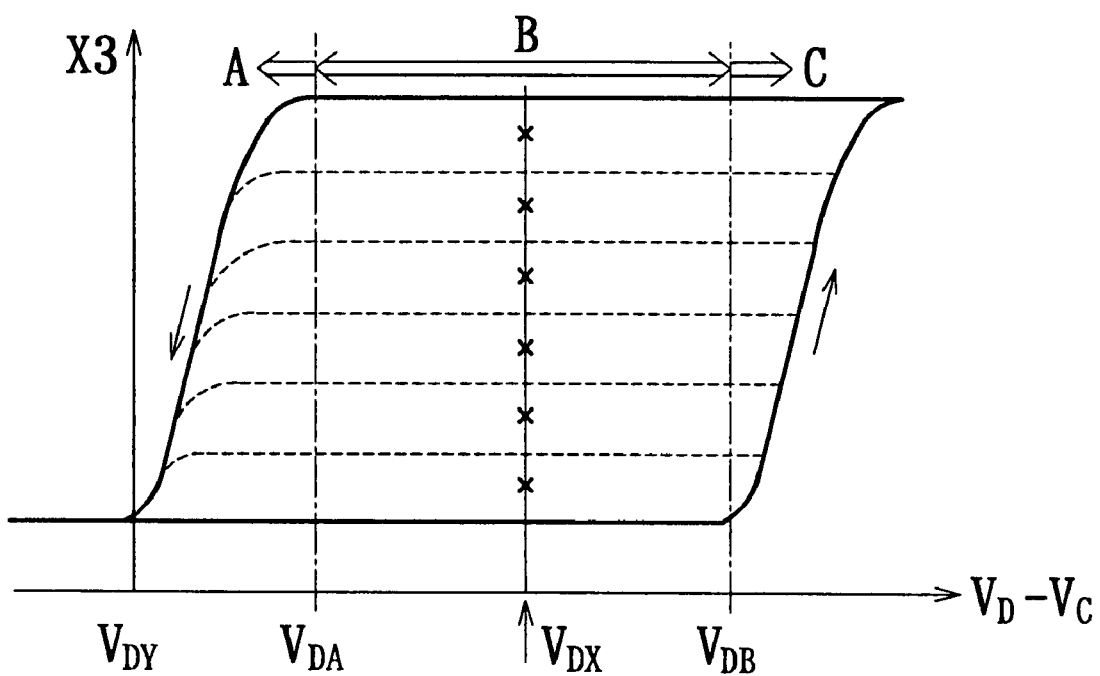
FIG. 10 is a view showing the relationship between the difference between the voltage of the actuator driving electrode and that of the actuator common electrode, and the displacement of the actuator.

FIG. 10 is a view showing the relationship between the difference between the voltage of the actuator driving electrode and that of the actuator common electrode, and the displacement x3 of the actuator. As shown in FIG. 10, if the difference between the voltage $V_D$ and the voltage $V_C$ changes within the range less than $V_{DA}$, the displacement x3 changes (region A), the difference between the voltage $V_D$ and the voltage $V_C$ changes within the range from $V_{DA}$ to $V_{DB}$, the displacement x3 remains constant (region B), and if the difference between the voltage $V_D$ and the voltage $V_C$ changes within the range more than $V_{DB}$, the displacement x3 changes (region C).

In the region A, the distance between the cathodes 61a, 61b and a grid 66 increases, and thus the plate current decreases. In the region B, the displacement state of the actuator is maintained. In the region C, the distance between the cathodes 61a, 61b and the grid 66 decrease, and thus the plate current increase.

Therefore, if the difference between the voltage $V_D$ and the voltage $V_C$ is set between $V_{DA}$ and $V_{DB}$, for example, the voltage $V_C$ is set to $-V_{DX}$ and the voltage $V_D$ is set to the neighborhood of zero, the displacement of the actuator is maintained without applying the voltage to the actuator driving electrodes 65a, 65b continuously. As a result, there is little power consumption resulting from the resistance of the actuator or a circuit including the actuator, and thus it is possible to reduce the power consumption further more, because a circuit for holding a constant voltage is provided at the side of the actuator common electrode, so that the power consumption resulting from the circuit does not increase even if the voltage $V_C$ is held at $-V_{DX}$, and a driving circuit mainly consist of parts such as transistor is provided on the side of the actuator driving electrode, there are many power consuming resistance component in the driving circuit, so that the power consumption is reduced by setting the voltage $V_D$ to the neighborhood of zero.

If the deformable layer 63a, 63b are composed of a piezoelectric material which is curvedly displaced in a concave manner when the voltage is applied, the similar property as described above is obtained. In this case, the distance between the cathodes 61a, 61b and the grid 66 decreases and thus the plate current increases in the region A, and the distance between the cathodes 61a, 61b and the grid 66 increases and thus the plate current decreases in the region C.

The current controlling element having characteristics explained with reference to FIGS. 9 and 10 preferably comprises a switching element which switches between the displacement motion and the maintenance of displacement state of said actuator. Thereby, the switching between the displacement motion and the maintenance of displacement state of the actuator is well performed, so that it is not necessary to apply the voltage to the second electrode in order to maintain the displacement of the actuator, and thus it is possible to reduce the power consumption of the current controlling element or the circuit including the current controlling circuit further more. Also, as there is no limitation of choice of an actuator material to be subjected to the displacement motion and the maintenance of displacement state of the actuator, and thus the limitation of choice of the actuator material is relaxed. The current controlling element comprising the switching element will be explained hereinafter.

Figure 11:
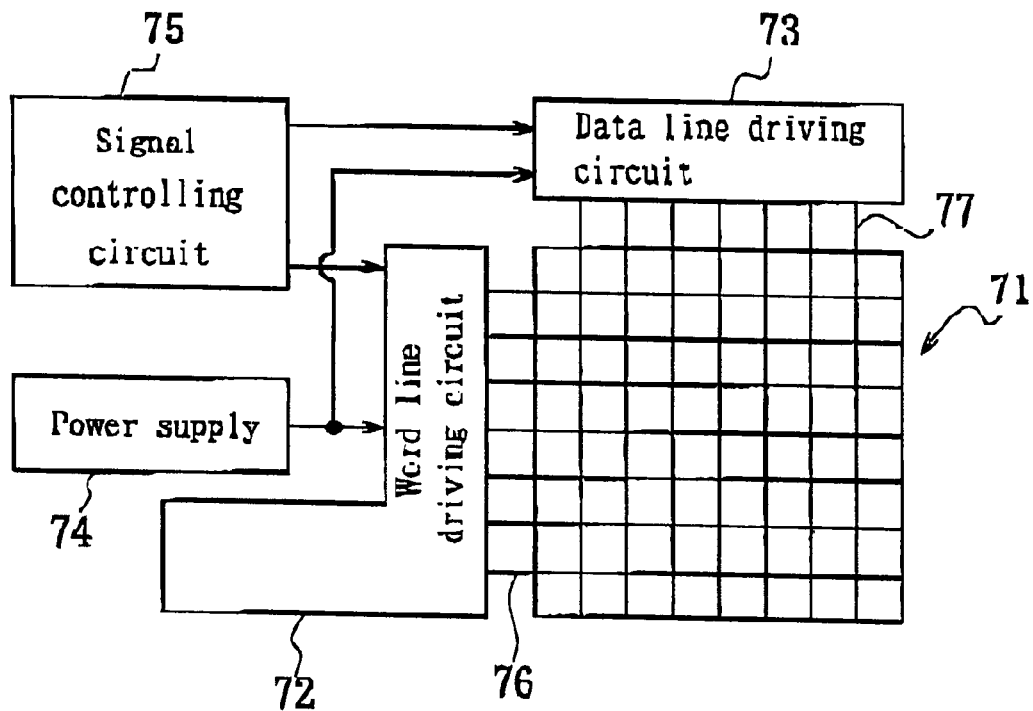
FIG. 11 is a view showing an example of a matrix array of current controlling elements, each of which comprises a switching element.

FIG. 11 is a view showing an example of a matrix array of current controlling elements, each of which comprises a switching element. This arrangement comprises an array of the current controlling elements, each of which comprises a switching element, a word line driving circuit 72, a data line driving circuit 73, a power supply 74, and a signal controlling circuit 75 supplying a control signal to the word driving circuit 72 and the data line driving circuit 73.

The word line driving circuit 72 supplies a certain number of driving signals to word lines 76 each corresponding to one of the driving signals selectively, and selects the actuator of the current controlling per row sequentially. The data line driving circuit 73 outputs a certain number of data signals to data lines 77 each corresponding to one of the data signals in parallel, and supplies the data signals to the switching elements in a row selected by the word line driving circuit 72, respectively.

The power supply 74 supplies a logical supply voltage for calculating in a logical circuit and two kinds of supply voltages for the word lines to the word line driving circuit 72. The power supply 74 also supplies the logical supply voltage and two kinds of supply voltage for the data lines to the data line driving circuit 73.

Figure 12:
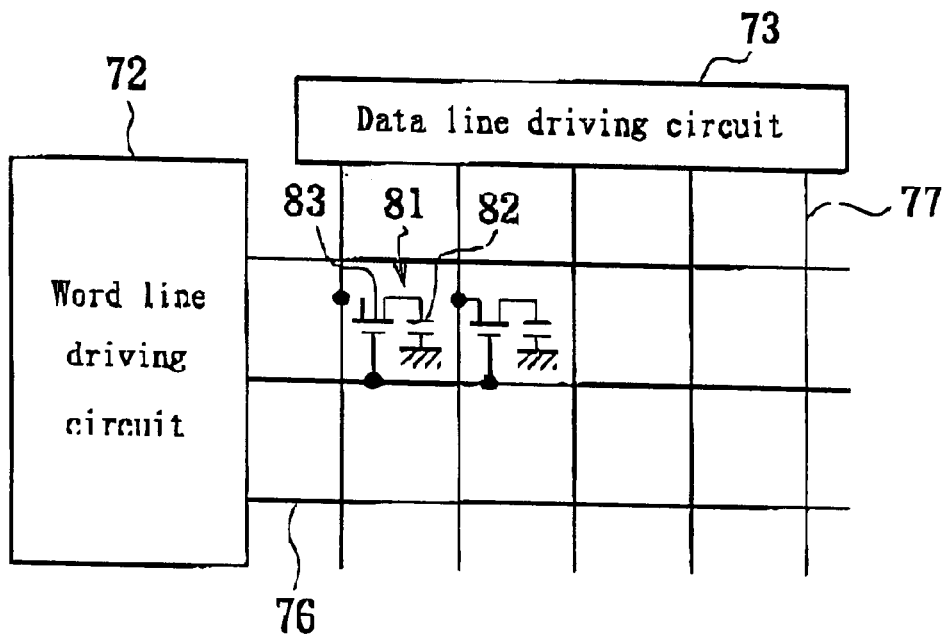
FIG. 12 is a view showing an example of an array of current controlling elements in which a transistor is used as the switching element.
Figure 13:
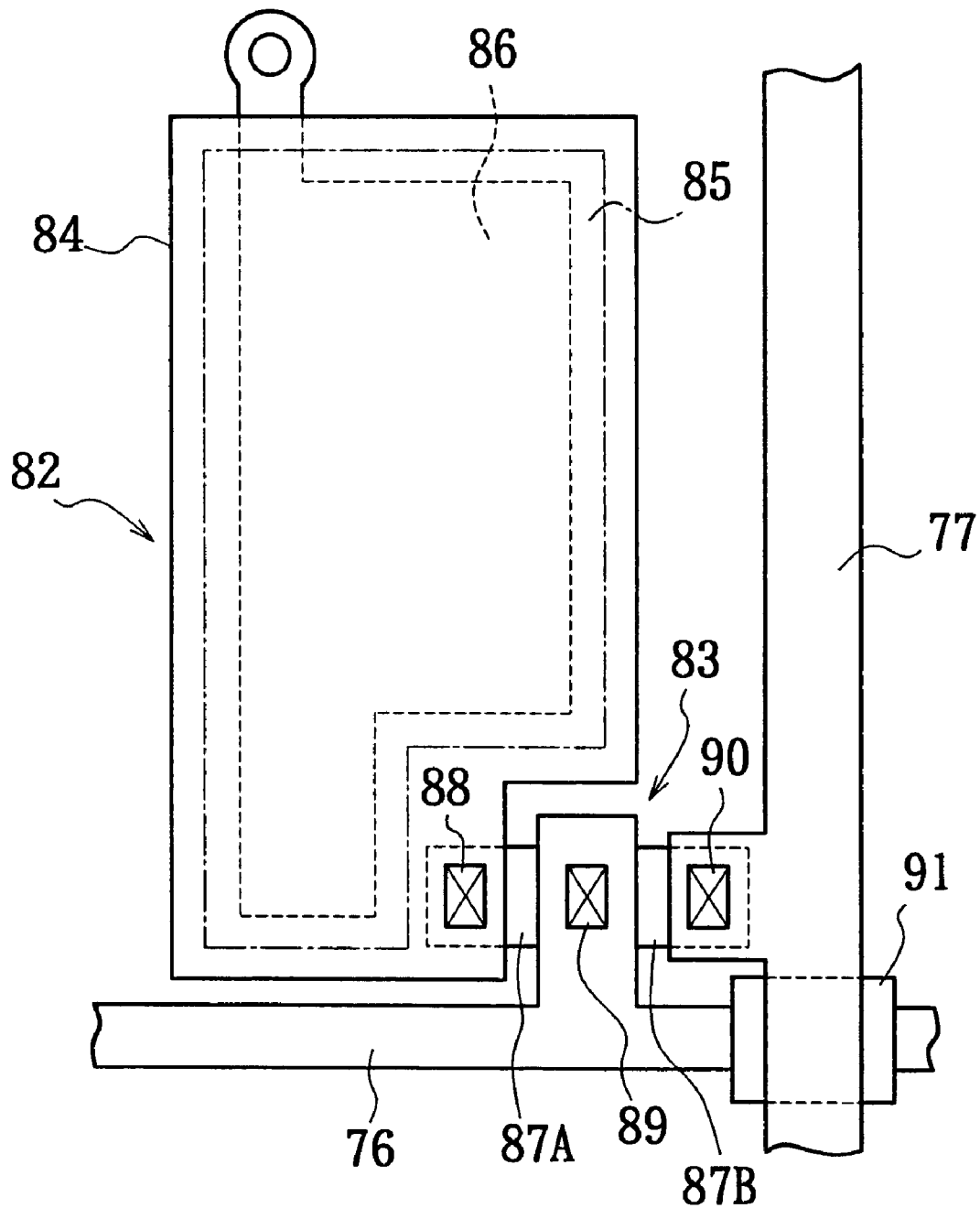
FIG. 13 is a top view showing an example of an array of current controlling elements in which a transistor is used as the switching element.

FIG. 12 is a view showing an example of a array of current controlling elements in which a transistor is used as the switching element, and FIG. 13 is a top view showing an example of a array of current controlling elements in which a transistor is used as the switching element. In this case, each of the current controlling element 81 has an actuator 82 and a transistor 83.

In FIG. 13, a plane shape of an actuator driving electrode 84 as shown in a solid line, a plane shape of a deformable layer 85 as shown in a dashed line, and an outer shape of an actuator common electrode 86 as shown in a broken line are rectangular, respectively. In this case, the area of the deformable layer 85 in the plane shape is larger than that of the actuator common electrode 86 in the outer shape, and is smaller than that of the actuator driving electrode 84 in the plane shape.

The actuator driving electrode 84 is connected to source/drain regions 87A through a contact 88. The word line 76 is connected to a gate electrode of the transistor 83 through a contact 89. The data line 77 is connected to drain/source regions 87B through a contact 90. A insulating layer 91 consisting of a silicon oxide layer, a glass layer, a resin layer and so on is interposed in an intersection of the word line 76 and the data line 77.

When a certain row is selected by the word line driving circuit 72, all transistors concerning to the row are turned on, thereby, the data signal through the data line driving circuit 73 is supplied to the actuator driving electrode 84 through a channel region of the transistor 83.

If a transistor is used as the switching element, the above-mentioned two kinds of the supply voltages for the word lines are a voltage to turn on the transistor 83 (hereinafter, "on voltage") and a voltage to turn off the transistor 83 (hereinafter, "off voltage").

Also, the above-mentioned two kinds of the supply voltages for the data lines are a voltage enough to curvedly displace the actuator 82 (hereinafter, "operating voltage") and a voltage enough to restore it to the original state (hereinafter, "reset voltage"). It is possible to obtain the desired amount of the plate current by preparing not less than two kinds of the operating voltages when selecting the actuator 82 and being capable of setting a plurality kinds of positions of the cathode to the plate.

Therefore, as the word line driving circuit 72 and the data line driving circuit 73, it is possible to use a simple circuit switching between two levels of the voltage ("H" or "L") only, for example, a serial-parallel converter comprising a push-pull circuit consisting two MOSFET serially connected to each other as shown in FIG. 14A or circuits as shown in FIG. 14B, the number of the circuit included in the serial-parallel converter is the number of the channels. By forming the data line driving circuit as shown in FIG. 14B, it is possible to apply two kinds of the operating voltages except for the reset voltage.

Figure 15:
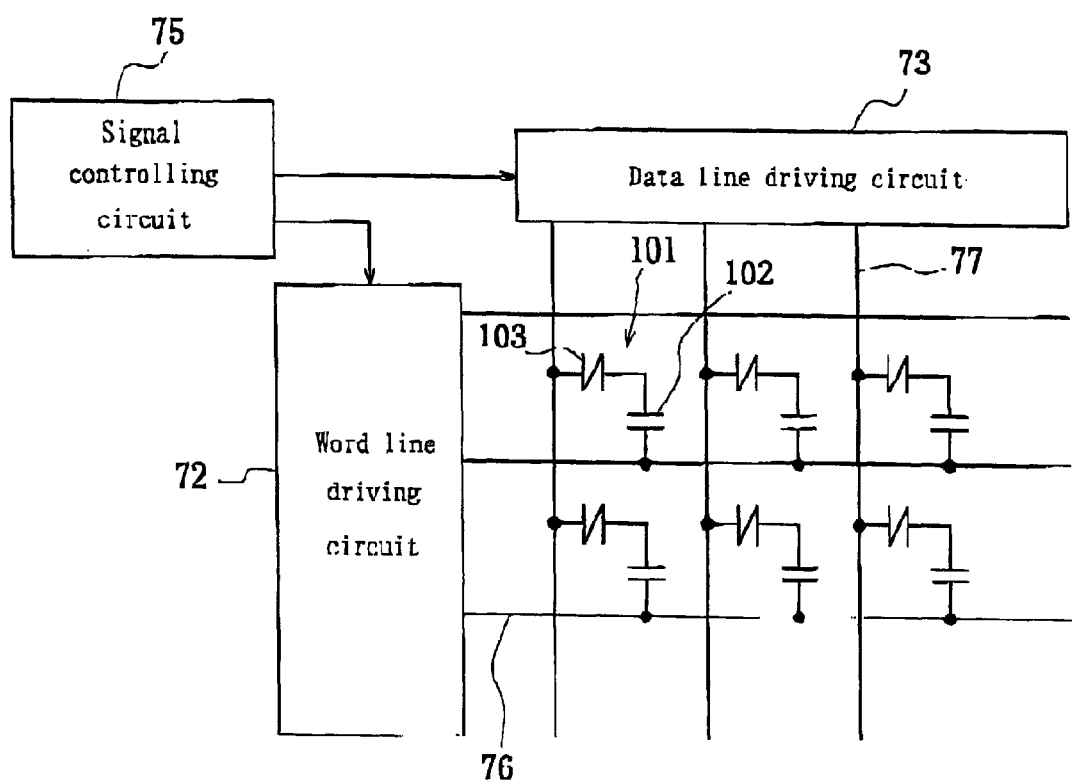
FIG. 15 is a view showing an example of an array of current controlling elements in which a varistor is used as the switching element.
Figure 16:
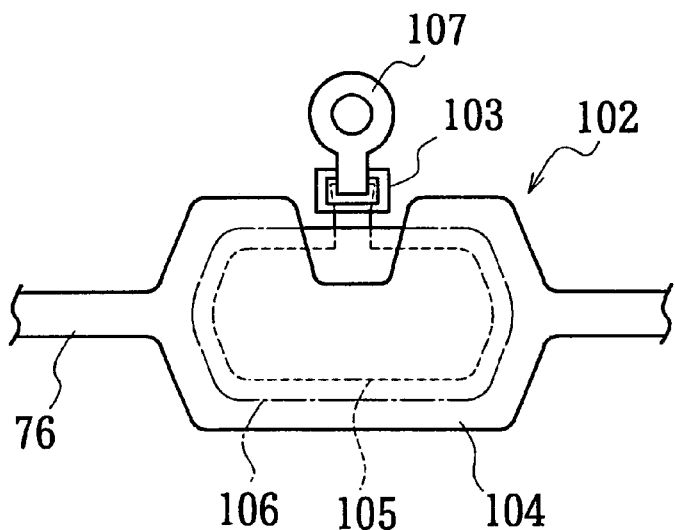
FIG. 16 is a top view showing an example of an array of current controlling elements in which a varistor is used as the switching element.

FIG. 15 is a view showing an example of a array of current controlling elements in which a varistor is used as the switching element, and FIG. 16 is a top view showing an example of a array of current controlling elements in which a varistor is used as the switching element. In this case, each of the current controlling elements has an actuator 102 and a varistor 103.

As shown in FIG. 16, the word line 76 is connected to an actuator common electrode 104, and the data line 77 is connected to an actuator driving electrode 105 shown in a broken line. Between the actuator common electrode 104 and the actuator driving electrode 105, there is a deformable layer 106 shown in a dashed line. A through-hole 107 electrically connects the actuator driving electrode 105 to the data line 77.

The varistor 103 is a resistive element changing the value of resistance non-linearly in accordance with the variation of the applied voltage, consists of a SiC varistor, a pnp varistor of Si, a varistor mainly composed of ZnO and so on, and has a negative property in which the value of the resistance decreases as the voltage across the ends of the varistor increases.

A preferable property of the varistor 103 will be described.

First, the off-resistance of the varistor 103 is set so that the rate of the variation of the applied voltage to the actuator 102 is within 5% when the leakage current (discharge) generates. When the off-resistance is too small, the charges stored in the actuator 102 are discharged, and the displacement state of the actuator 102 cannot be maintained. The rate of the variation of the applied voltage to the actuator 102 is explained as the sum of the rate of the variation resulting from the partial potential of the electric capacity in the varistor 103 (5%) and the rate of the variation resulting from the leakage current.

By setting the off-resistance in such a manner, the CR time constant becomes relatively large, and by effecting the low-pass filter resulting from such a relatively large CR time constant, the applied voltage to the actuator 102 is maintained at substantially constant value by smoothing. As a result, the displacement state of the actuator 102 is maintained.

On the other hand, the on-resistance of the varistor 103 is set at such a value that the applied voltage to the actuator 102 rises up to 95% of the defined voltage When an on-signal is supplied to one electrode of the varistor 103, the applied voltage to the actuator 102 rises rapidly, and reaches to 95% of the defined voltage instantly. Therefore, the actuator is curvedly displaced in one direction instantly.

Figure 17A:
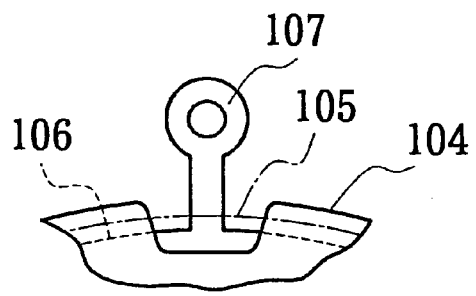
FIGS. 17A and 17B are top views showing an example of a array of the current controlling elements in which a varistor is used as the switching element, respectively.
Figure 17B:
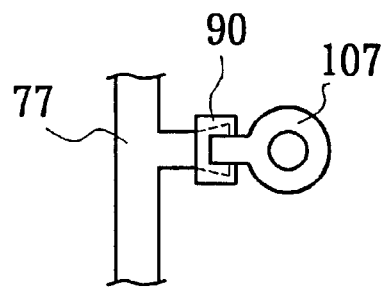

In the example as shown in FIG. 16, the actuator 102, the varistor 103 and the word line 76 are formed on one face of a substrate, and the data line 77 is formed on the other face of the substrate, however, it is possible to form the actuator 102 and the word line 76 on one face of the substrate and to form the varistor 103 and the data line 77 on the other face of the substrate as shown in FIGS. 17A and 17B.

Figure 18:
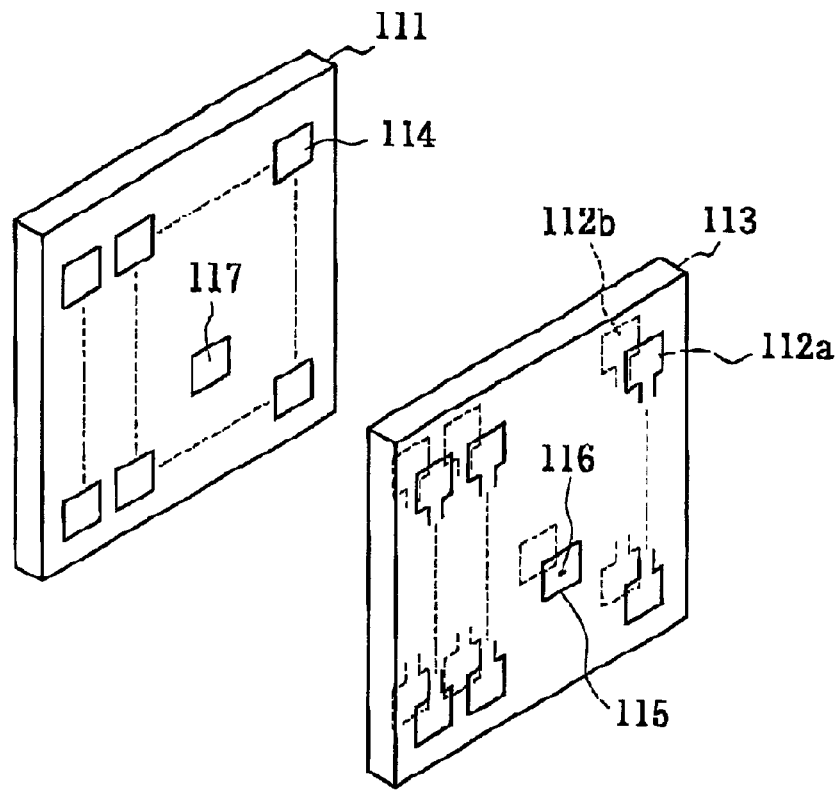
FIG. 18 is a view explaining the way to constitute the current controlling element in which a varistor is used as the switching element.

If the switching element is constituted as shown in FIG. 18, there is a first substrate 111 providing a plurality of actuators (not shown in FIG. 18) on one face, and a second substrate 113 providing electrodes 112a, 112b on both faces. For the actuators, through-holes extending from one face of the first substrate 111 to the other face of the first substrate 111 are formed, respectively, and for the though-holes, electrode pads 114 are provided on the other face of the first substrate 111, respectively. In other words, these electrode pads 114 are provided on the positions corresponding to the actuators provided on one face of the first substrate 111, respectively.

The electrode pads 114 are provided on the position corresponding to the electrodes 112, respectively. By selecting a material composing the second substrate 113 appropriately, the function of the varistor corresponding to the actuators formed on the first substrate 111 is obtained.

Among the electrodes provided on the second substrates 113, the electrode 115, which is not necessary to have the function of the varistor, for example, the electrode 115 for taking out the word line 76 is connected to the electrode pad 117 for taking out the word line 76 formed on the other face of the word line 76 by a through-hole 116.

When the other face of the first substrate 111 providing the electrode pads 114 is fitted on one face of the second substrate 113 providing the electrodes 112b, the electrode pad 114 and the corresponding electrode 112b are bonded to each other with a solder, a conductive resin and so on. Thereby, the actuator driving electrode of the actuator and the data line 77 are electrically connected to each other through the varistor 103.

The thickness of the second substrate 113 is determined in accordance with the required varistor voltage, and the surface area of the electrode of the varistor 103 is determined by the required electrostatic capacity and current capacity.

In order to reduce the leakage current between the electrodes 112a, 112b neighboring each other and formed on the same face of the second substrate 113 and to increase the degree of freedom to arrange the electrodes 112a, 112b, for example, each of the grooves is provided between the electrodes 112a, 112b neighboring each other and formed on the same face of the second substrate 113, or a material with a relatively small particle diameter is selected as that composing the second substrate 113 and the thickness of the second substrate 113 is made small.

If each of the grooves is provided between the electrodes 112a, 112b neighboring each other, the distance between the electrode 112a, 112b neighboring each other and formed on the same face increases in essence, and thus the varistor voltage between them increases. On the other hand, if a material with a relatively small particle diameter is selected as that comprising the second substrate 113 and the thickness of the second substrate 113 is made small, the varistor voltage between the electrodes 112a, 112b neighboring each other increases while a certain varistor voltage is maintained between the electrodes 112a, 112b.

As the second substrate 113 for composing the varistors 103, in addition to the first substrate 111 forming the actuators 102 and the other face of the first substrate 111, is put on one face of the second substrate 113 in such a manner, it is very simple to construct the wiring to connect the varistor 103 between the actuator 102 and the data line 77, it is possible to make the device with a small entire size, and thus it is advantageous in view of the development of the yield, the reduction of the manufacturing cost and so on.

If the varistor is used as the switching element, it is possible to adopt the electrode construction as shown in FIGS. 6 and 7.

Figure 19:
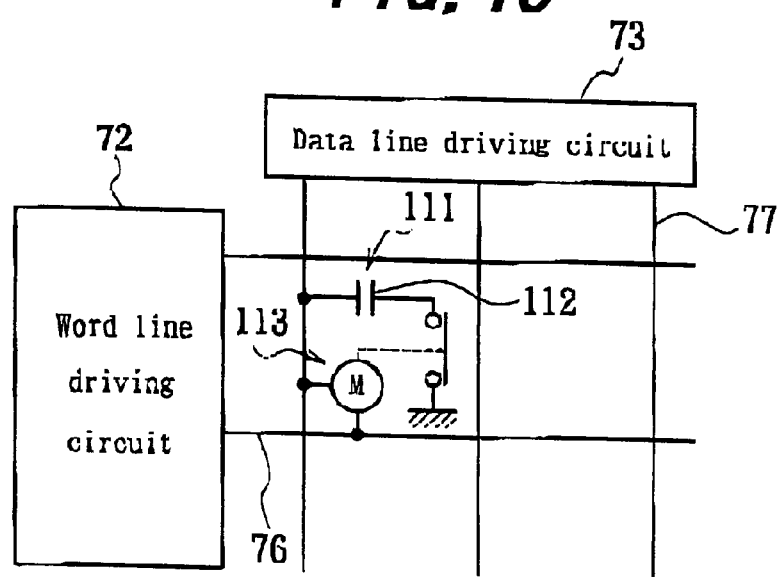
FIG. 19 is a view showing an example of an array of current controlling elements in which a piezoelectric relay is used as the switching element.
Figure 20:
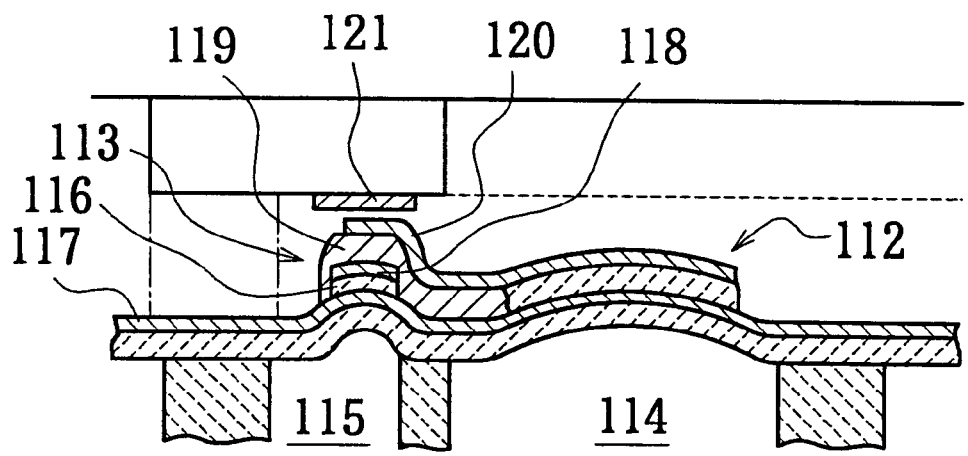
FIG. 20 is a sectional view showing a current controlling element in which a piezoelectric relay is used as the switching element.
Figure 21:
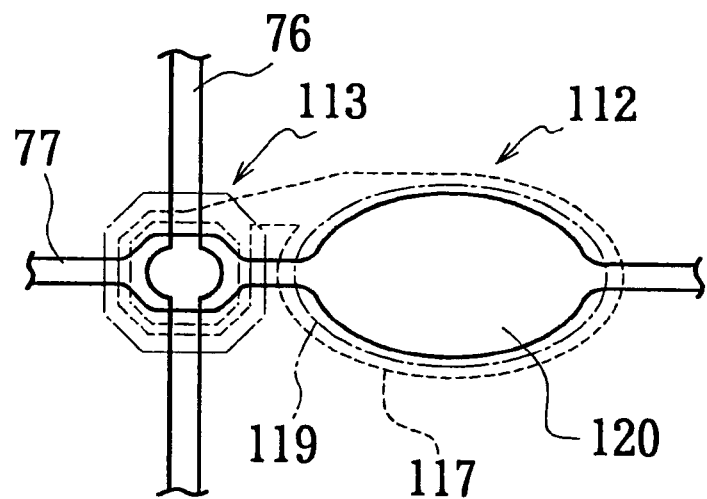
FIG. 21 is a top view showing a current controlling element in which a piezoelectric relay is used as the switching element.

FIG. 19 is a view showing an example of a array of current controlling elements in which a piezoelectric relay is used as the switching element, FIG. 20 is a sectional view showing a current controlling element in which a piezoelectric relay is used as the switching element, and FIG. 21 is a top view showing a current controlling element in which a piezoelectric relay is used as the switching element. In this case, each of the current controlling elements 111 has an actuator 112 and a piezoelectric relay 113.

As shown in FIGS. 20 and 21, the piezoelectric relay 113 is arranged at the position neighboring the actuator 112. A space 115 for constructing the piezoelectric relay 113 is provided at the inside of a substrate for actuator 112 in addition to a space 114 for constructing the actuator 112. The space 115 is connected to external by a through hole not shown.

In this case, the thickness of the portion forming the space 115 is smaller than that of the portion except that forming the space 115. As a result, the portion forming the space 115 has a construction tending to suffer from the vibration resulting from external stress, and functions as a vibrating section of the piezoelectric relay 113. The portion, except that forming the space 115, functions as a stationary section of the piezoelectric relay 113 supporting the vibrating section of the piezoelectric relay 113.

As shown in FIGS. 20 and 21, the piezoelectric relay 113 comprises a deformable layer 116, an electrode 117 formed under the deformable layer 116, an electrode 118 for connecting to the word line 76, an insulating layer 119 formed on the electrode 118, an electrode 120 formed on the insulating layer 119, and an earth electrode 121 facing to the electrode 120. Among these electrodes, the electrode 117 serves as the actuator driving electrode, and the electrode 120 serves as the actuator common electrode.

Figure 22:
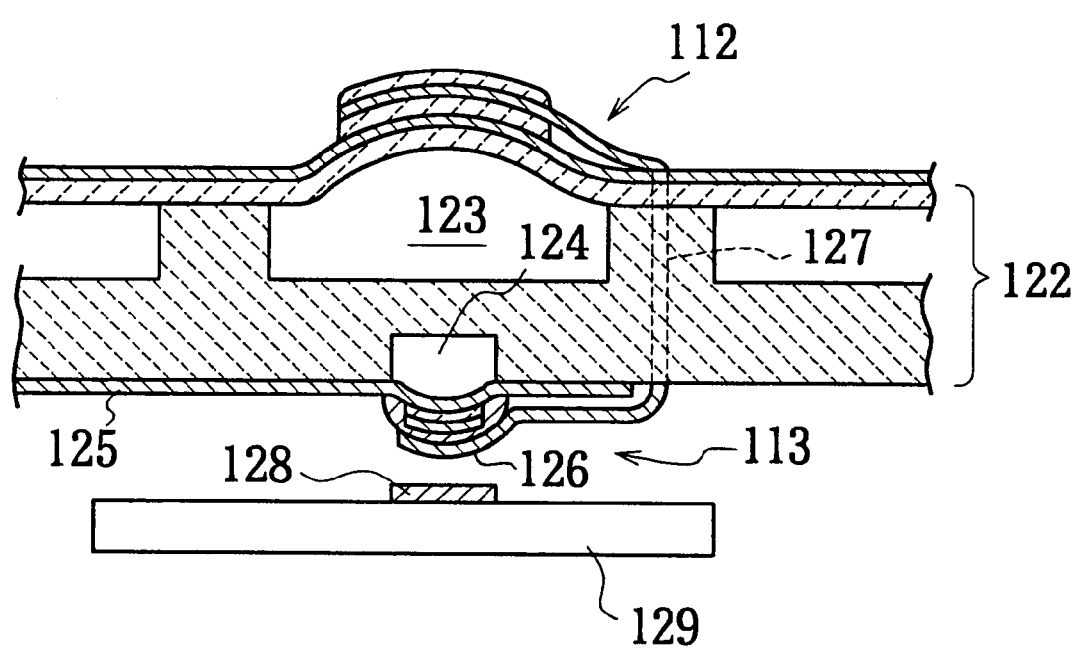
FIG. 22 is a sectional view showing another current controlling element in which a piezoelectric relay is used as the switching element.

FIG. 22 is a sectional view showing another current controlling element in which a piezoelectric relay is used as the current controlling element. In this example, the actuator 112 is provided on one face of a substrate 122, and the piezoelectric relay 113 is provided on the other face of the substrate 122.

In this case, spaces 123 and 124 are formed at the portions corresponding to the actuator 112 and the piezoelectric relay 113, respectively. A data line 125 only for switching is provided on the other face of the substrate 122. An electrode 126 formed on the piezoelectric relay 113 is wired by a through-hole 127 formed on the substrate 122, and an earth electrode 128 contacting the electrode 126 selectively is formed on a printed wiring board 129 arranged below the substrate 122.

The present invention is not limited to the details of the illustrated embodiments, but may be embodied with various changes, modifications and improvements.

For example, a current controlling element according to the present invention can be employed as a large output current-service switch, such as a thyristor. Also, an electrical current control element according to the present invention is capable of determining the current control range of a plate current according to a movable stroke of the actuator, which provides a stable overcurrent limiter. Further, arranging two or more grids between the cathode and the plate provides multielectrode tubes, such as tetrodes and pentodes.

What is claimed is:

1. A current controlling element comprising:
   an actuator having a fixed portion, a vibrating portion supported on said fixed portion so as to undergo vibrations, and an actuating portion including first and second electrodes formed on at least one side of a deformable layer, said actuator generating a displacement motion by holding an electric potential of said first electrode at a constant value and variable-controlling an electric potential of said second electrode;
   a cathode formed on said actuator for emitting electrons; and
   a plate for receiving said electrons emitted from said cathode;
   wherein said current controlling element changes a position of said cathode with respect to said plate by said displacement motion of said actuator to control a current value taken out of said plate.

2. A current controlling element according to claim 1, wherein said electrical potential of said plate with respect to said cathode is held at a constant value.

3. A current controlling element according to claim 2, wherein at least one grid is arranged between said cathode and said plate.

4. A current controlling element according to claim 1, wherein at least one grid is arranged between said cathode and said plate.

5. A current controlling element according to claim 4, wherein said current controlling element comprises a plurality of cathodes corresponding to one plate, and a plurality of actuators corresponding to said plurality of cathodes, respectively.

6. A current controlling element according to claim 4, wherein said vibrating portion is formed of ceramic.

7. A current controlling element according to claim 4, wherein said vibrating portion and said fixed portion are integrally formed.

8. A current controlling element according to claim 4, wherein said vibrating portion and said fixed portion are integrally formed of ceramics.

9. A current controlling element according to claim 4, wherein said actuating portion, said vibrating portion and said fixed portion are integrally formed.

10. A current controlling element according to claim 4, wherein said deformable layer is formed of least one kind of a piezoelectric material, an electrostrictive material, and an antiferroelectric material.

11. A current controlling device according to claim 4, comprising a plurality of current controlling elements, and a substrate on which a plurality of actuators of said current controlling elements are integrally formed.

12. A current controlling element according to claim 1, wherein said first electrode serves as said cathode.

13. A current controlling element according to claim 1, wherein said first electrode is identical in electrical potential with said cathode.

14. A current controlling element according to claim 1, wherein an insulating layer is formed on at least one of said first and said second electrodes, and said cathode is formed on said insulating layer.

15. A current controlling element according to claim 1, wherein said current controlling element comprises a plurality of cathodes corresponding to one plate, and a plurality of actuators corresponding to said plurality of cathodes, respectively.

16. A current controlling element according to claim 1, wherein said vibrating portion is formed of ceramics.

17. A current controlling element according to claim 1, wherein said vibrating portion and said fixed portion are integrally formed.

18. A current controlling element according to claim 1, wherein said vibrating portion and said fixed portion are integrally formed of ceramics.

19. A current controlling element according to claim 1, wherein said actuating portion, said vibrating portion and said fixed portion are integrally formed.

20. A current controlling element according to claim 1, wherein said deformable layer is formed of at least one kind of a piezoelectric material, an electrostrictive material, and an antiferroelectric material.

21. A current controlling device according to claim 1, comprising a plurality of said current controlling, and a substrate on which a plurality of said actuators of said current controlling elements are integrally formed.

22. A current controlling element comprising:
   an actuator having a fixing portion, a vibrating portion supported on said fixed portion so as to undergo vibrations, and an actuating portion including first and second electrodes formed on at least one side of a deformable layer, said actuator generating a displacement motion by holding an electric potential of said first electrode at a constant value and variable-controlling an electric potential of said second electrode;

a cathode being formed on said actuator and emitting electrons; and a plate receiving said electrons emitted from said cathode;

wherein said current controlling element changes a position of said cathode with respect to said plate by said displacement motion of said actuator to control a current value taken out of said plate;

and said actuator maintains a displacement state by setting the electric potential of said first electrode at a certain value while holding the electric potential of said second electrode at substantially zero.

23. A current controlling element according to claim 22, wherein said current controlling element further comprises a switching element which switches between said displacement motion and maintenance of said displacement state of said actuator.

24. A current controlling device according to claim 23, comprising a plurality of said current controlling elements, and a substrate on which a plurality of said actuators of said current controlling elements are integrally formed.

25. A current controlling element according to claim 22, wherein said switching element has any one of a transistor, a varistor and a piezoelectric relay.

26. A current controlling element according to claim 22, wherein said electrical potential of said plate with respect to said cathode is held at a constant value.

27. A current controlling element according to claim 25, wherein at least one grid is arranged between said cathode and said plate.

28. A current controlling element according to claim 22, wherein at least one grid is arranged between said cathode and said plate.

29. A current controlling element according to claim 28, wherein said current controlling element comprises a plurality of cathodes corresponding to one plate, and a plurality of actuators corresponding to said plurality of cathodes, respectively.

30. A current controlling element according to claim 28, wherein said vibrating portion is formed of ceramics.

31. A current controlling element according to claim 28, wherein said vibrating portion and said fixed portion are integrally formed.

32. A current controlling element according to claim 28, wherein said vibrating portion and said fixed portion are integrally formed of ceramics.

33. A current controlling element according to claim 28, wherein said actuating portion, said vibrating portion and said fixed portion are integrally formed.

34. A current controlling element according to claim 28, wherein said deformable layer is formed of least one kind of a piezoelectric material, an electrostrictive material, and an antiferroelectric material.

35. A current controlling device according to claim 28, comprising a plurality of said current controlling elements, and a substrate on which a plurality of said actuators of said current controlling elements are integrally formed.

36. A current controlling element according to claim 22, wherein said first electrode serves as said cathode.

37. A current controlling element according to claim 22, wherein said first electrode is identical in electrical potential with said cathode.

38. A current controlling element according to claim 22, wherein an insulating layer is formed on at least one of said first and said second electrodes, and said cathode is formed on said insulating layer.

39. A current controlling element according to claim 22, wherein said current controlling element comprises a plurality of cathodes corresponding to one plate, and a plurality of actuators corresponding to said plurality of cathodes, respectively.

40. A current controlling element according to claim 22, wherein said vibrating portion is formed of ceramics.

41. A current controlling element according to claim 22, wherein said vibrating portion and said fixed portion are integrally formed.

42. A current controlling element according to claim 22, wherein said vibrating portion and said fixed portion are integrally formed of ceramics.

43. A current controlling element according to claim 22, wherein said actuating portion, said vibrating portion and said fixed portion are integrally formed.

44. A current controlling element according to claim 22, wherein said deformable layer is formed of at least one kind of a piezoelectric material, an electrostrictive material, and an antiferroelectric material.

* * * * *